(12) United States Patent
Aekins

(10) Patent No.: US 7,677,931 B2
(45) Date of Patent: Mar. 16, 2010

(54) METHOD FOR MULTIPORT NOISE COMPENSATION

(75) Inventor: Robert A. Aekins, Quaker Hill, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 12/413,865

(22) Filed: Mar. 30, 2009

(65) Prior Publication Data
US 2009/0191758 A1    Jul. 30, 2009

Related U.S. Application Data

(62) Division of application No. 11/453,389, filed on Jun. 15, 2006, now Pat. No. 7,530,854.

(51) Int. Cl.
*H01R 24/00* (2006.01)

(52) U.S. Cl. .................................................. 439/676

(58) Field of Classification Search ................. 439/676, 439/949, 540.1; 29/855–856, 874–877, 883–884
See application file for complete search history.

(56) References Cited

U.S. PATENT DOCUMENTS

| | | |
|---|---|---|
| 2,714,194 A | 7/1955 | Beynink |
| 4,211,462 A | 7/1980 | Wolfthal |
| 5,046,967 A | 9/1991 | Majernik et al. |
| 5,059,140 A | 10/1991 | Philippson et al. |
| 5,186,647 A | 2/1993 | Denkmann et al. |
| 5,232,340 A | 8/1993 | Morgan |
| 5,269,708 A | 12/1993 | DeYoung et al. |
| 5,281,170 A | 1/1994 | Murphy |
| 5,299,956 A | 4/1994 | Brownell et al. |
| 5,310,363 A | 5/1994 | Brownell et al. |
| 5,326,284 A | 7/1994 | Bohbot et al. |
| 5,341,419 A | 8/1994 | Ferry |
| 5,350,324 A | 9/1994 | Guilbert |
| 5,362,257 A | 11/1994 | Neal et al. |
| 5,399,107 A | 3/1995 | Gentry et al. |
| 5,414,393 A | 5/1995 | Rose et al. |
| 5,432,484 A | 7/1995 | Klas et al. |
| 5,503,572 A | 4/1996 | White et al. |

(Continued)

FOREIGN PATENT DOCUMENTS

EP        0 674 364 A1    9/1995

(Continued)

*Primary Examiner*—Phuong K Dinh
(74) *Attorney, Agent, or Firm*—McCarter & English, LLP

(57) ABSTRACT

Methods are provided for reducing port to port crosstalk on a multiport assembly. Steps of the method include placing at least one BEMI in at least one compensation region, disposed on a PCB. The BEMI reduces port to port crosstalk noise by generating an opposite polarity signal to an unwanted noise signal generated through port to port adjacency. The PCB includes a plurality of ports, at least including adjacent first and second ports, each of which is an RJ45 jack port. Each port of the plurality of ports includes a plurality of modular insert pins, and is associated with an IDC pin group. The at least one compensation region includes one or more regions for generating noise compensation with respect to crosstalk noise resulting from coupling between respective modular insert pins of, or IDC pins associated with, the first and second ports, respectfully.

19 Claims, 6 Drawing Sheets

U.S. PATENT DOCUMENTS

| | | | |
|---|---|---|---|
| 5,513,065 A | 4/1996 | Caveney et al. |
| 5,547,405 A | 8/1996 | Pinney et al. |
| 5,586,914 A | 12/1996 | Foster, Jr. et al. |
| 5,599,209 A | 2/1997 | Belopolsky |
| 5,618,185 A | 4/1997 | Aekins |
| 5,628,653 A | 5/1997 | Haas et al. |
| 5,639,266 A | 6/1997 | Patel |
| 5,647,770 A | 7/1997 | Belopolsky |
| 5,674,093 A | 10/1997 | Vaden |
| 5,687,478 A | 11/1997 | Belopolsky |
| 5,697,817 A | 12/1997 | Bouchan et al. |
| 5,700,167 A | 12/1997 | Pharney et al. |
| 5,759,070 A | 6/1998 | Belopolsky |
| 5,779,503 A | 7/1998 | Tremblay et al. |
| 5,797,764 A | 8/1998 | Coulombe et al. |
| 5,830,005 A | 11/1998 | Watanabe |
| 5,864,089 A | 1/1999 | Rainal |
| 5,911,602 A | 6/1999 | Vaden |
| 5,913,702 A | 6/1999 | Garcin |
| 5,931,703 A | 8/1999 | Aekins |
| 5,938,479 A | 8/1999 | Paulson et al. |
| 5,997,358 A | 12/1999 | Adriaenssens et al. |
| 6,023,200 A | 2/2000 | Rhee |
| 6,086,428 A | 7/2000 | Pharney et al. |
| 6,089,923 A | 7/2000 | Phommachanh |
| 6,113,418 A | 9/2000 | Kjeldahl |
| 6,116,943 A | 9/2000 | Ferrill et al. |
| 6,120,329 A | 9/2000 | Steinman |
| 6,155,881 A | 12/2000 | Arnett et al. |
| 6,168,474 B1 | 1/2001 | German et al. |
| 6,183,306 B1 | 2/2001 | Caveney |
| 6,186,834 B1 | 2/2001 | Arnett et al. |
| 6,231,397 B1 | 5/2001 | De la Borbolla et al. |
| 6,290,546 B1 | 9/2001 | Pharney |
| 6,302,741 B1 | 10/2001 | Fasold et al. |
| 6,319,048 B1 | 11/2001 | Aekins et al. |
| 6,346,010 B1 | 2/2002 | Emplit |
| 6,361,354 B1 | 3/2002 | Viklund et al. |
| 6,394,844 B1 | 5/2002 | Frias Valero et al. |
| 6,443,777 B1 | 9/2002 | McCurdy et al. |
| 6,524,131 B2 | 2/2003 | Schmidt et al. |
| 6,533,618 B1 | 3/2003 | Aekins |
| 6,608,764 B2 | 8/2003 | Clark et al. |
| 6,611,943 B2 | 8/2003 | Shibata et al. |
| 6,729,899 B2 | 5/2004 | Aekins et al. |
| 6,729,901 B2 | 5/2004 | Aekins et al. |
| 6,802,743 B2 | 10/2004 | Aekins et al. |
| 6,840,816 B2 | 1/2005 | Aekins |
| 6,848,943 B2 | 2/2005 | Machado et al. |
| 6,893,296 B2 | 5/2005 | Aekins et al. |
| 6,896,557 B2 | 5/2005 | Aekins et al. |
| 6,962,503 B2 | 11/2005 | Aekins |
| 7,037,140 B2 | 5/2006 | Aekins et al. |
| 7,179,115 B2 | 2/2007 | Hashim |
| 7,232,340 B2 * | 6/2007 | Hammond et al. ..... 439/607.26 |
| 2002/0151208 A1 | 10/2002 | Aekins |
| 2003/0095395 A1 | 5/2003 | Clark et al. |
| 2005/0095920 A1 | 5/2005 | Aekins et al. |
| 2005/0151208 A1 | 7/2005 | Uno et al. |

FOREIGN PATENT DOCUMENTS

| | | |
|---|---|---|
| EP | 0 955 703 A2 | 11/1999 |
| EP | 0 995 703 A3 | 11/2001 |

* cited by examiner

METHOD FOR MULTIPORT NOISE COMPENSATION

CROSS-REFERENCE TO RELATED APPLICATIONS

This application is a divisional of co-pending U.S. Non-Provisional application Ser. No. 11/453,389, entitled "LOW NOISE MULTIPORT CONNECTOR", filed Jun. 15, 2006.

BACKGROUND

1. Technical Field

The present disclosure relates to systems and methods that compensate for port to port crosstalk noise generated from electrical component proximity within a multiport assembly.

2. Background Art

Unshielded Twisted Pair (UTP) cable is a popular and widely used source of data transfer media because it is a very flexible and low cost media that can be used for either voice or data communications. In fact, UTP cable has rapidly become the de facto standard for Local Area Networks (LANs), in-building voice, and data communications applications. As UTP cabling continues to be an essential choice of media transmission, new and improved methods must be employed to meet the requirements of a transmitting data source. In an UTP, a pair of copper wires generally forms a twisted pair. For example, a pair of copper wires with diameters of 0.4-0.8 mm may be twisted together and wrapped with an insulated coating to form an UTP. The twisting of the wires increases the noise immunity and reduces the bit error rate (BER) of the data transmission to some degree. In addition, using two wires, rather than one, to carry each signal permits differential signaling to be utilized. Differential signaling is generally immune to the effects of external electrical noise.

The wide acceptance of UTP for data and voice transmission is primarily due to the large installed base, low cost, and ease of new installation. Demands have increased on networks using UTP systems, such as 1000 Mbit/s and 10,000 Mbit/s transmission rates, which has forced the development of industry standards requiring higher system bandwidth performance and lower noise-connecting hardware. What began as a need for connecting hardware to provide near-end crosstalk (NEXT) loss of less than −36 dB at 16 MHz, has evolved to −54 dB at 100 MHz and −34 dB at 500 MHz for category 6 and future category 6a systems, respectively. As the transmission rates have increased, so has system noise, in particular NEXT, Far-End Crosstalk (FEXT) and Alien Near-End and Far-End Crosstalk (ANEXT/AFEXT).

For any data transmission event, a received signal will consist of a transmission signal modified by various distortions. The distortions are added by the transmission system, along with additional unwanted signals inserted somewhere between transmission and reception. The unwanted signals are referred to as noise. Noise is a major limiting factor in the performance of today's communication systems. Problems that arise from noise include but are not limited to data errors, system malfunctions, and loss of desired signals.

Generally, crosstalk noise occurs when a signal from one source is coupled to another line. Crosstalk noise is also classified as electromagnetic interference (EMI). EMI occurs through the radiation of electromagnetic energy. Electromagnetic energy waves can be derived using Maxwell's wave equations. These equations are defined using two components: electric and magnetic fields. In unbounded free space, a sinusoidal disturbance propagates as a transverse electromagnetic wave. This means that the electric field vectors are perpendicular to the magnetic field vectors that lie in a plane perpendicular to the direction of the wave. NEXT noise is the effect of near-field capacitive (electrostatic) and inductive (magnetic) coupling between source and victim electrical transmissions. NEXT increases the additive noise at the receiver and therefore degrades the signal-to-noise ratio (SNR).

Crosstalk using a plug that mates to a modular insert setup such as that illustrated in FIG. 1 will increase as system speeds or system transmission frequencies increase. The transposition or twisting of the transmitting wire pair helps minimize crosstalk generated in a cable. However, coupling occurs as the signal travels through untwisted sections, such as plugs and plug contacts.

In a differential balance two wire per pair transmission system, signals that travel along each wire (or other media) are equal in amplitude but opposite in phase. These signals at any instantaneous moment in time couple electric and/or magnetic fields to adjacent lines, which reduces their SNR. The acceptable SNR depends on the type or quality of service that is required by the system. To remove the noise components, a forward signal equal but opposite to the original signal may be induced. According to Fourier's wave theory and Maxwell's theory of electromagnetic fields, by coupling the opposite phase of the transmitted signal to a previously coupled adjacent line signal, the two signals cancel each other completely and therefore remove the noise from the adjacent line.

The American National Standards Institute/Telecommunication Industry Association/Electronics Industries Alliance (ANSI/TIA/EIA) has finalized a standard defining electrical performance for systems that utilize the 1-250 MHz frequency bandwidth range for category 6 electrical performances. The increasing demand for more bandwidth and improved communication systems (e.g., Ethernet 1000BASE-T) on UTP cabling will require improved connecting hardware. The ANSI/TIA/EIA is also working on higher standards defining electrical performance for systems that utilize the 1-500 MHz frequency bandwidth range for 100 meters of UTP cabling transmission called 100 Ohm Augmented Category 6 Cabling. The TIA/EIA 568B.2-10 titled, "Transmission Performance Specification for 4 Pair 100 Ohm Augmented Category 6 Cabling" for channel link defines the specified frequency bandwidth of 1-500 MHz, and a minimum NEXT value of −33.1 dB at 100 MHz and −26 dB at 500 MHz. By increasing the bandwidth from 1-250 MHz (category 6) to 1-500 MHz (Augmented category 6, C6a), tighter controls of component noise susceptibility are necessary. With the development of new standards, new connecting hardware noise levels will have to be lower than that of old connecting hardware used in category 5e and 6 media systems. FCC part 68.500 provides standard mechanical dimensions to ensure compatibility and matability between modular plug housings of different manufacturers.

Attempts to reduce internal crosstalk noise in electrical connectors have been made. For example, U.S. Pat. No. 5,618,185 to Aekins discloses a reduced crosstalk electrical connector including a housing that receives four pairs of elongated contacts for receiving electrical signals and a printed circuit board (PCB). The PCB utilizes a single stage or cancellator section (signal compensation) for reducing NEXT. That stage contains a cancellator that is opposite the original noise magnitude's polarity. NEXT noises are reduced internally, but external noise signals relative to adjacent ports are not reduced.

Additional attempts to reduce internal crosstalk noise in electrical connectors include, for example, U.S. Pat. No.

5,997,358 to Adriaenssens et al., which discloses a reduced crosstalk electrical connector that utilizes two stages of signal compensation for reducing NEXT. The first stage is opposite the original noise polarity and the second stage is of the same polarity as the original noise.

Thus, methods for providing positive compensation to reduce crosstalk noise in connecting hardware are addressed in U.S. Pat. No. 5,618,185 to Aekins and U.S. Pat. No. 5,299,956 to Brownell et al., the contents of which are hereby incorporated by reference. Methods for providing positive and negative compensation to reduce crosstalk noise in connecting hardware is addressed in U.S. Pat. No. 6,840,816 to Aekins and U.S. Pat. No. 5,997,358 to Adriaenssens et al., the contents of which are hereby incorporated by reference.

Although previously disclosed circuitry systems described above have been used to improve and/or compensate for internal crosstalk noise, they do not improve external crosstalk noise, such as ANEXT or AFEXT. ANEXT is the coupled crosstalk noise that occurs from one adjacent signaling media port to another signaling media port at the near-end of transmission. AFEXT is the coupled crosstalk noise that occurs from one adjacent signaling media port to another signaling media port at the far-end (received) transmission. The prior art strictly deals with internal noise issues of a connecting hardware and does not reduce external noise generated by other signal path components.

A need exists for an improved UTP connector that reduces internal as well as external noise, generated by adjacent ports, for all frequencies, e.g., up to and including the category 6a transmission levels. Moreover, a need exists for systems/techniques for rebalancing of noise on a single controlled source that contains non-interchangeable components. A further need exists for an improved connector that does not lessen the impedance characteristics of connected wire pairs and minimizes common mode (CM) noise that occurs from typical cancellator/compensation circuits. These and other needs are addressed by the systems and methods of the present disclosure.

SUMMARY

The present disclosure provides systems and methods for reducing port to port crosstalk noise within a multiport assembly. An exemplary system of the present disclosure includes a multiport assembly having: (i) a printed circuit board (PCB) and (ii) a plurality of ports having electrical components mounted with respect to the PCB; wherein each of the electrical components associated with each of the ports include modular insert pins and an insulation displacement contact (IDC) pin group, and wherein the PCB includes or defines regions that reduce port to port crosstalk noise through capacitive regional coupling between electrical components and/or traces in communication with two or more of the plurality of ports. In an exemplary embodiment, the PCB is adaptable to be connected to a rear IDC housing and a front housing subassembly, yielding a multiport connector assembly. Each of the plurality of ports may be advantageously adapted to electrically interface with a RJ45 modular plug.

Noise reducing regions according to the present disclosure may include, but are not limited to: (i) region (a) generating noise compensation with respect to crosstalk noise that results from coupling between the modular insert terminals of one of the plurality of ports relative to IDC pins associated with an adjacent port; (ii) region (b) generating noise compensation with respect to crosstalk noise that results from coupling between modular insert terminals of a second of the plurality of ports relative to modular insert pins associated with an adjacent port; (iii) region (c) generating noise compensation with respect to crosstalk noise that results from coupling between modular insert terminals of a third of the plurality of ports relative to an IDC pins associated with an adjacent port; and (iv) region (d) generating noise compensation with respect to crosstalk noise that results from coupling between IDC pins associated with a fourth of the plurality of ports relative to IDC pins associated with another port.

Capacitive regional coupling is generally employed to generate noise compensation in the noted regions, e.g., by disposing at least one balancing electromagnetic isolator (BEMI) in at least one of the noise reducing/compensation regions. In an exemplary embodiment, at least one coupling radiator is electrically connected to one or more electrical components associated with at least one of the ports that is in communication with at least one noise reducing region defined in or on the circuit board. One or more BEMI may be electrically connected to at least one of said electrical components of the plurality of ports to facilitate noise reduction according to the present disclosure.

In an exemplary embodiment, an assembly is described wherein at least one BEMI and at least one coupling radiator are placed in each of regions (a), (b), (c), and (d). Placement of a BEMI and coupling radiator in each of the noise reducing regions is effective to reduce port to port crosstalk noise. An assembly of the present disclosure can include at least one balancing conductive substrate disposed in at least one of the noise reducing regions, the conductive substrate being in electrical communication with at least one of the coupling radiators disposed therein.

An exemplary system of the present disclosure includes an assembly that includes a plurality, e.g., six, ports substantially aligned axially on the PCB. The ports include modular insert pins that are electrically connected through traces to an IDC pin group associated with the port. Each IDC pin group of the ports has 8 IDC pins. The IDC pin groups of ports one, three, and five may be axially aligned substantially parallel to the ports on a first end or edge (e.g., the top end/edge) of the PCB, and the IDC pin groups of ports two, four, and six may be axially aligned substantially parallel to the ports on a second end or edge (e.g., the bottom end/edge) of the PCB.

An exemplary method of the present disclosure is effective in reducing port to port crosstalk on a multiport assembly by placing at least one BEMI in at least one port to port noise compensation region of a PCB. The compensation signal(s) generated in the at least one compensation region is/are effective to substantially compensate for noise that results from port to port coupling. The BEMI is adapted to reduce port to port crosstalk noise by generating an opposite polarity signal relative to an unwanted noise signal. In an exemplary embodiment, at least one coupling radiator is disposed in at least one of the noise reducing regions and is electrically coupled to at least one of the electrical components of the plurality of ports. Another exemplary method according to the present disclosure provides or disposes at least one balancing conductive substrate in at least one of the noise reducing regions, such balancing conductive substrate being in electrical communication with at least one coupling radiator disposed in such noise reducing region.

Noise reducing regions of an exemplary method include: (i) region (a) generating noise compensation with respect to crosstalk noise that results from coupling between the modular insert terminals of one of the plurality of ports relative to IDC pins associated with an adjacent port; (ii) region (b) generating noise compensation with respect to crosstalk noise that results from coupling between modular insert terminals of a second of the plurality of ports relative to modular insert pins associated with an adjacent port; (iii) region (c) generating noise compensation with respect to crosstalk noise that results from coupling between modular insert terminals of a third of the plurality of ports relative to an IDC pins associated with an adjacent port; and (iv) region (d) generating noise compensation with respect to crosstalk noise that results from coupling between IDC pins associated with a fourth of the plurality of ports relative to IDC pins associated with another port. In an exemplary embodiment, at least one BEMI and at least one coupling radiator are placed in each of regions (a), (b), (c), and (d) so as to reduce port to port crosstalk noise through the generation of compensating signals.

A method and system for reducing crosstalk noise are disclosed according to the present disclosure wherein a multiport assembly includes a front housing subassembly and a rear IDC housing that is adapted to connect to a PCB to form a multiport connector assembly. In this embodiment, each of the plurality of ports of the multiport connector assembly is adapted to electrically interface with a RJ45 modular plug. In an exemplary embodiment, a method is described wherein the plurality of ports includes six ports substantially aligned axially on the PCB; and each port is electrically connected, through modular insert pins associated with that port and a plurality of traces, to IDC pins associated with the port, wherein each IDC pin group of the six ports has 8 IDC pins. The IDC pin groups of ports one, three, and five are axially aligned substantially parallel to the ports on a first end/edge (e.g., the top end) of the PCB and the IDC pin groups of ports two, four, and six are axially aligned substantially parallel to the ports on a second end/edge (e.g., the bottom end) of the PCB.

The disclosed systems, assemblies and methods are effective in reducing port to port crosstalk by generating compensating signals in compensating regions defined on a PCB. In exemplary embodiments, four compensating regions are defined on the PCB, thereby generating compensating signals with respect to four distinct sources of crosstalk noise associated with the multiport assembly.

Additional features, functions and benefits of the disclosed systems and methods will be apparent from the description which follows, particularly when read in conjunction with the appended figures.

BRIEF DESCRIPTION OF THE DRAWINGS

To assist those of ordinary skill in the art in making and using the disclosed systems and methods, reference is made to the appended figures, wherein.

DESCRIPTION OF EXEMPLARY EMBODIMENT(S)

Figure 1:
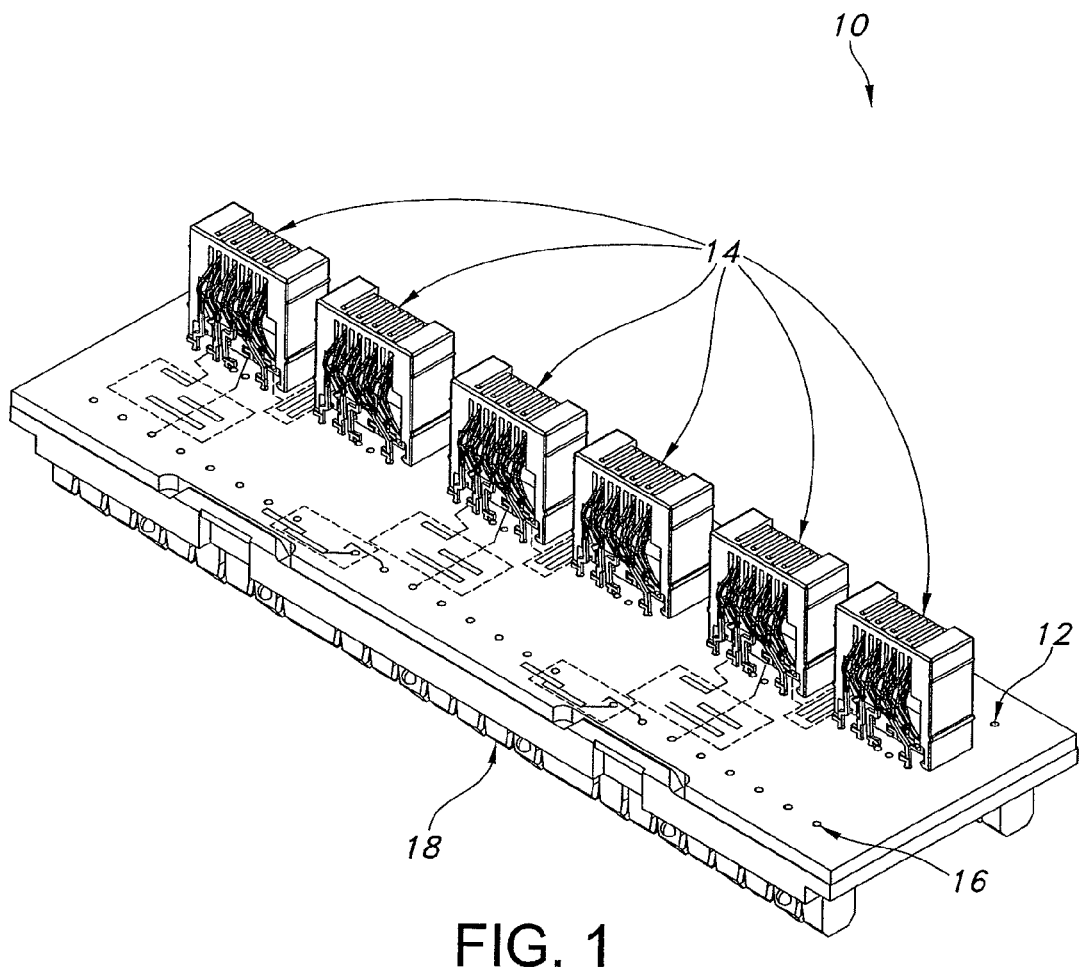
FIG. 1 is a front view 3D diagram of a multiport PCB subassembly in accordance with an embodiment of the present disclosure.

The present disclosure relates to connecting hardware adapted to be used in telecommunication systems to reduce port to port crosstalk noise and thereby improve the systems transmission of signals, including high speed data signals. In an exemplary embodiment, a connector, typically a multiport assembly, is described that reduces port to port crosstalk noise by utilizing a low signal radiated modular insert that is electrically connected to a PCB having a positive and negative combination compensation technique, without the need for shielding or additional physical components. Moreover, in an exemplary embodiment, an inexpensive, simple to manufacture and use connector/assembly is described that reduces port to port crosstalk noise between connector terminals.

A multiport connecting hardware of the present disclosure is typically characterized by: (a) a multiport assembly; (b) input interface connecting point(s) consisting of a matable plug that forms an electrical connection to a modular plug housing having electrical current conducting contact terminals; (c) a PCB, adapted to have a transmitting signal path from input to output; and (d) output IDC pins electrically connecting the PCB to connecting output transmission wires.

In an exemplary embodiment, systems and methods are described for reducing port to port crosstalk noise generating from adjacent lines occurring at adjacent transmission points. ANEXT is typically near-end crosstalk noise that couples from one cabling media to an adjacent cabling media, measured at the near-end or transmitter. AFEXT is typically far-end crosstalk noise that couples from one cabling media to an adjacent cabling media, measured at the far-end or receiver. Power sum alien near-end crosstalk (PSANEXT) loss is typically a combination of signal coupling from multiple near-end disturbing cabling pairs into a disturbed pair of a neighboring cabling or part thereof, measured at the near-end. PSAFEXT loss is a combination of signal coupling from multiple far-end disturbing cabling pairs into a disturbed pair of a neighboring cabling or part thereof, measured at the far-end. IEEE 802.3an 10 Gigabit Ethernet 10 Gbe and TIA TR42.7 working groups have identified ANEXT and AFEXT as a major noise problem effecting proper 10 Gbe operation over UTP cabling systems with ANEXT typically being the worse of the two. The initial PSANEXT requirement for UTP cabling system, also called Augmented Category 6 UTP is shown in Table 1 below:

TABLE 1

PSANEXT from TIA 568B.2-A10 draft for Augmented
Category 6 100 meters channel link cabling

| MHz | dB |
|-----|-----|
| 10  | −70 |
| 100 | −60 |
| 250 | −54 |
| 400 | −51 |
| 500 | −49.5 |

Connecting hardware systems running 10 Gbe data signals should be designed to meet traditional category 6 and recognized additional 10 Gbe UTP cabling parameters. Due to the adjacency of connecting hardware in a cabling system, ANEXT and AFEXT are typically present.

The present disclosure describes a sub assembly having RJ45 modular insert ports electrically connected to a PCB. It should be readily apparent to those skilled in the art that noise generation will occur from one insert port to adjacent insert ports and other adjacent signal carrying components. During transmission of differential signals, electromagnetic fields are generated from the assembly both internally and in various external locations. In some external locations, electromagnetic fields or radiation (EMR) on the PCB are balanced and in some areas the signal transfer produces unbalanced EMR upon adjacent ports. The unbalance EMR is coupled onto adjacent port's signal transmission paths that directly increase port to port crosstalk noise. In a preferred embodiment, to reduce port to port noise, proper phase noise that is opposite to the unwanted radiated noise is introduced into the effected areas. Balancing electromagnetic isolators (BEMI) are effectively placed at strategic locations to provide rebalancing to the effective adjacent port signals. BEMI are typically electrically isolated traces (stubs) on a PCB that are of a polarity of a differential circuit's positive and negative signal transmission used to produce near field signal radiation. The BEMI near field is the signal radiation that is created by a transmitting conductive source within a predetermined signal's strength region for the purpose of coupling to one or more receiving sources. Adding BEMI provides crosstalk balance to an adjacent port's corrupted or unbalanced signal by radiated signal capacitive coupling.

In an exemplary embodiment, the BEMI compensation signal is at least partially opposite to the original noise e polarity of a differential signal line. For example, if unwanted noise upon an adjacent signaling port creates a more positive polarity, then it is counterbalanced by a negative BEMI signal added within that positive region. Likewise, if unwanted noise upon an adjacent signaling port creates a more negative polarity, then it is counterbalanced by a positive BEMI signal added within that negative region.

In an exemplary embodiment, reduction of port to port crosstalk, such as ANEXT, is generally achieved by using an assembly for a communication system consisting of a dielectric insert port electrically connected to a PCB having first, second, third, fourth, fifth, sixth, seventh and eighth RJ45 input terminals arranged in an ordered array. Due to the adjacency of the port's mated plug interfaces, port to port crosstalk noise is generated at unwanted levels. The interface crosstalk noise is created by adjacent first and second pins and seventh and eighth pins of an Electronics Industry Association T568B Register Jack Plug RJ45 configuration. The eighth pin, typically the right most signaling wire of an RJ45 plug of pair combination four, is adjacent to pin 1 of the left most signaling wire of an RJ45 plug of pair combination two.

In an exemplary embodiment, systems and methods are described that are adapted to control and reduce TIA/EIA electrical parameters such as PSANEXT and AFEXT and provide a simpler path to differential impedance control by allowing non-separation of differential pairs. Moreover, an exemplary system is adapted to control and reduce common mode (CM) noise by opposing signal coupling within a port transmission path. The reduction of CM noise aids in reducing ANEXT as well as PSANEXT in a differential signaling cabling system by reducing stray signals that can couple to adjacent wire pairs.

The present disclosure provides an assembly having RJ45 modular jack insert ports, a PCB, and IDC terminal pin groups. In an exemplary embodiment, a system is described having compensation regions that reduce coupled noise resulting from adjacency of two or more RJ45 ports. The present disclosure relates to systems and methods for generating compensating noise for balancing electrical noise. RJ45 modular insert ports and/or a PCB are adapted to be used for high frequency transfer of data signals to interface connectors for UTP media and, more particularly, utilize a modular insert with a PCB that contains sections of positive and/or negative opposing compensation techniques to produce low port to port crosstalk noise characteristics.

Reference is made to the drawings, wherein like reference numerals identify the same or similar components of the subject disclosure. TIA/EIA commercial building standards have recently defined category 6a electrical alien crosstalk performance parameters for a higher bandwidth (500 MHz) RJ45 plug system. The TIA/EIA category 6a alien crosstalk or ANEXT parameter is a requirement needed for proper operation of 10GBASE-T network UTP cabling. EIA standard wiring formation for a T568B style RJ45 plug is typically used for a modular insert connecting hardware. For a category 6a connecting hardware cabling system, EIA RJ45 wiring style is an exemplary formation used throughout the cabling industry.

FIG. 1 illustrates a schematic of a front side of a circuit board sub assembly 10 including PCB 12, six modular inserts 14, adapted to electrically interface with a RJ45 modular plug, and rear IDC pins 16 encapsulated inside a rear plastic IDC housing 18. In an exemplary embodiment, an UTP connected to a RJ45 plug has eight contacts, positioned in accordance with a standard FCC part 68 RJ45 telecommunication plug. The eight contacts are arranged in four pairs in accordance with T568B requirements. Typically, pair 1 are attached to contact positions 4 and 5, pair 2 are attached to contact positions 1 and 2, pair 3 are attached to contact positions 3 and 6, and pair 4 are attached contact positions 7 and 8. The contact positions are used for tip (positive voltage) and ring (negative voltage) signal transmissions. For T568B category 6a frequencies, unwanted port to port crosstalk noise is induced mainly between contact positions 1 and 8 vertically from the modular insert contacts. Port to port crosstalk noise also occurs from IDC pin to modular vertical contact, IDC to IDC, and a modular pin's end point to IDC pins.

Figure 2:
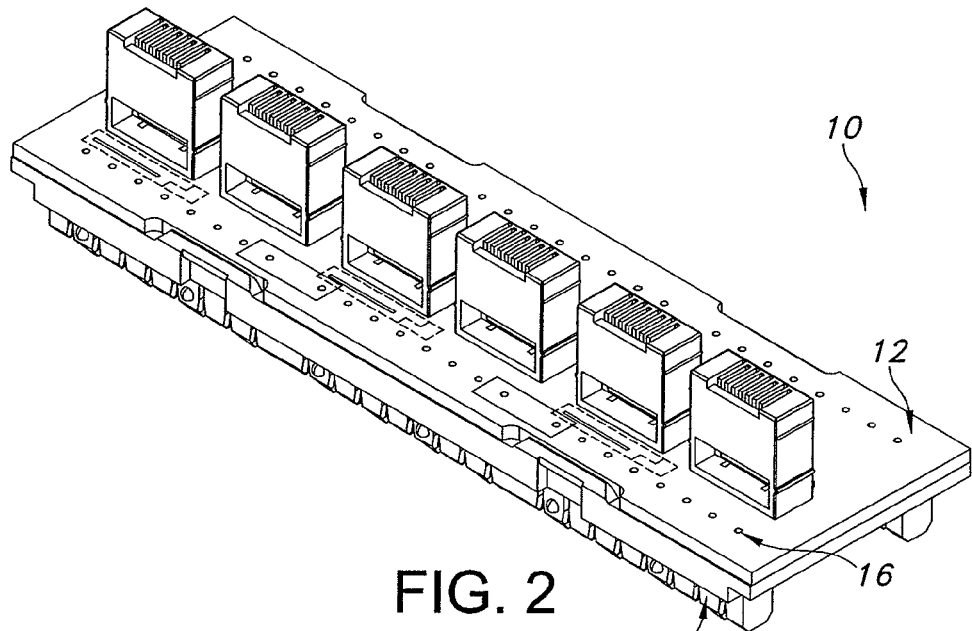
FIG. 2 is a rear view 3D diagram of a multiport PCB subassembly in accordance with an embodiment of the present disclosure.

FIG. 2 is a schematic illustrating a rear side view of circuit board sub assembly 10 including PCB 12, six modular insert pins 14, adapted to electrically interface with a RJ45 modular plug, and rear IDC pins 16 encapsulated inside rear plastic IDC housing 18.

Figure 3:
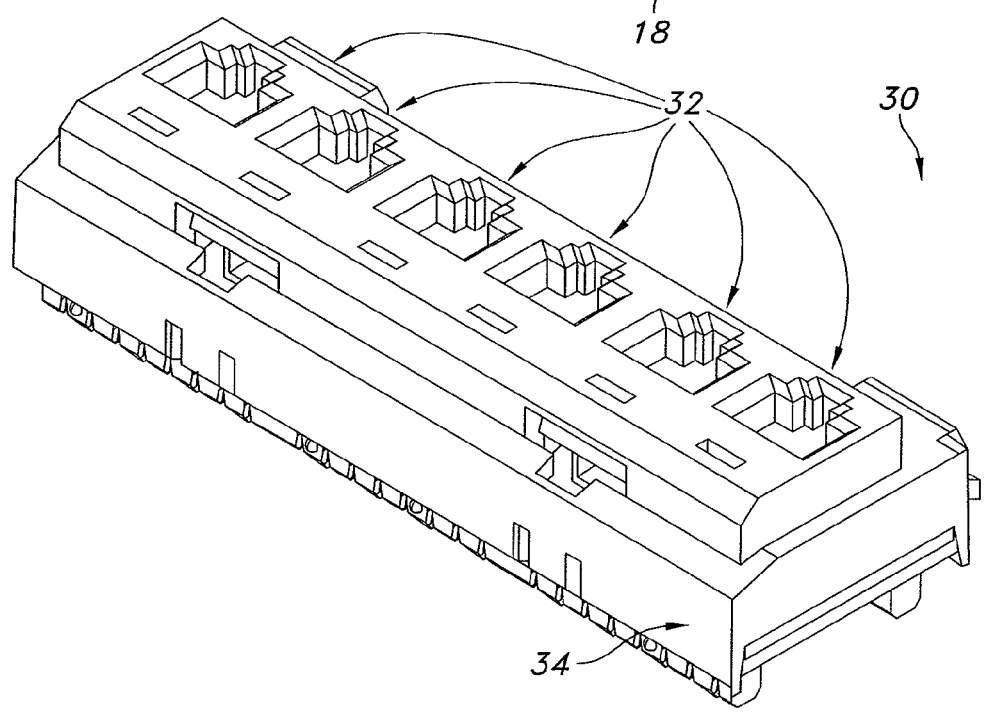
FIG. 3 is a front view 3D diagram of a multiport connector assembly with front modular housing in accordance with an embodiment of the present disclosure.

FIG. 3 is a schematic illustrating a front side of a multiport connector assembly 30 including six ports 32 with front modular plastic material housing sub assembly cover 34.

Assembly 30 includes circuit board sub assembly 10 wherein sub assembly cover 34 is adapted to connect with sub assembly 10.

Figure 4:
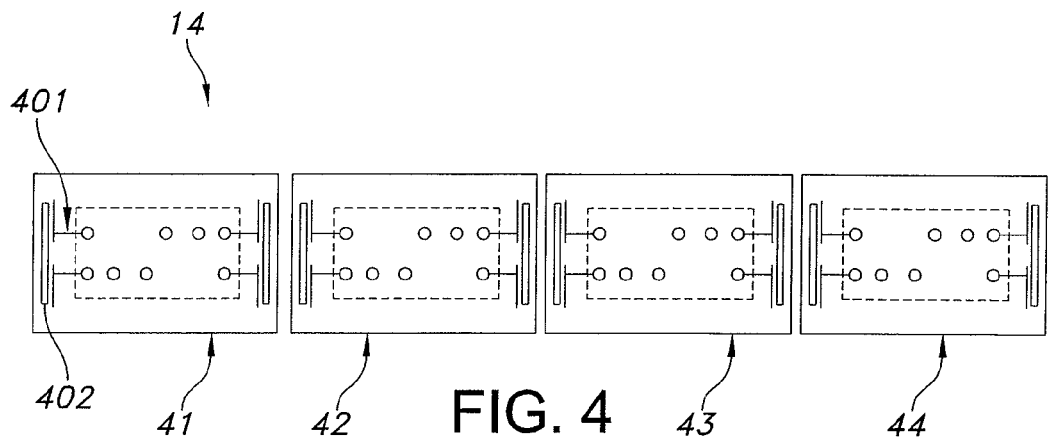
FIG. 4 is a schematic diagram of modular insert locations of an exemplary PCB in accordance with an embodiment of the present disclosure.

FIG. 4 is a schematic illustrating an exemplary embodiment of four modular inserts 14, and their locations on an exemplary PCB. Ports 41, 42, 43, and 44 are each electrically connected to two or more coupling radiators 401. Each coupling radiator 401 from one port is coupled to one common conductive substrate 402 from the same port. Each port emits unwanted port to port crosstalk to an adjacent port. The coupled noise resulting from adjacent ports is typically from one port's left most pins to another port's right most pins or vice versa. To counter balance the port to port noise, a balance conductive wall, substrate 402, is placed immediately to the right or left of each port's modular insert pins. This balance, $b_n$, conductive substrate is coupled with dual polarities of the transmitting electrical signal, +n−n, thus producing a zero balance $0 b_n = +1n-1n$. Adjacent ports, which are to the left or right of a transmitting port thus receives a $0 b_n$ noise as opposed to, for example $1.5 b_n$, thereby reducing port to port crosstalk noise.

Figure 5:
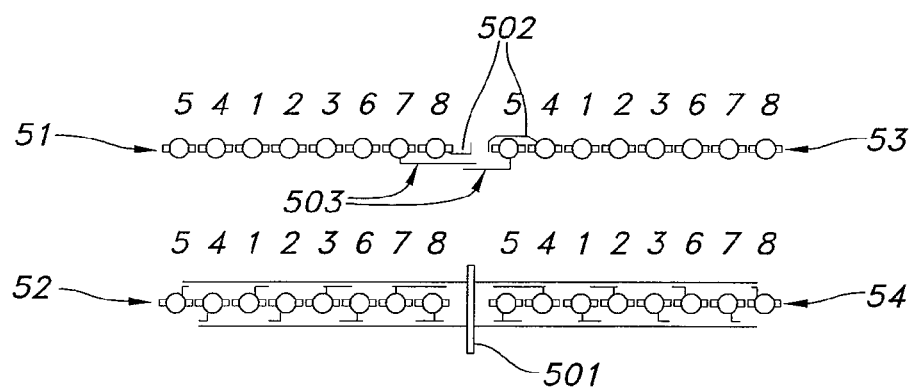
FIG. 5 provides schematic diagrams of IDC pin group locations of an exemplary PCB in accordance with an embodiment of the present disclosure.

FIG. 5 is a schematic illustrating the IDC locations of a multiport sub assembly that includes two or more coupling radiators 502 from one port with another port that contains two or more coupling radiators 502. Illustrated are IDC pin groups 51, 52, 53, and 54 corresponding to ports 41, 42, 43, and 44, respectively. The coupled noise resulting from adjacent ports is typically from a port's left most IDC pins to another port's right most adjacent pins or vice versa. To counter balance the port to port noise, a balance BEMI 503 is placed in at least one noise compensation region. When the port 41 of FIG. 4 is the signal transmitter, a balance BEMI is created, thus IDC pin 8 of IDC pin group 51 has positive signal radiation being capacitively coupled upon pin 4 of IDC pin group 53. The coupling between BEMI radiators (BE-MIX$_c$) occurs at a distance at least twice the distance of the width of the isolators 2 nI (BEMIX$_c$=2 nI). The 2 nI is because of the indirect coupling, that is, greater than at least twice the originated noise source coupling distance that originally created the unbalanced crosstalk noise. The originated noise port is more spatial in its EM radiation coupling to its adjacent conductive neighboring ports.

FIG. 5 illustrates IDC pin group locations of a multiport sub assembly that includes two or more coupling radiators 502 from one port coupled to one common conductive substrate 501 from that port. Each port emits unwanted port to port crosstalk to an adjacent port. The coupled noise among adjacent ports typically results from a port's left most pins to another port's right most pins or vice versa. To counter balance the port to port noise, a balance conductive wall substrate 501 is placed between adjacent pin groups. This balance, $b_n$, conductive substrate is coupled with dual polarities of a transmitting electrical signal, +n−n, thus producing a balance $b_n = +1n-1n$, that is less than the unbalanced noise, $Ub_n$, which is induced into the adjacent port. Adjacent ports receive a $0 b_n$ noise as opposed to, for example $1.5 b_n$, therefore reducing port to port crosstalk noise. FIG. 5 is also an illustration of multiple pin pairs electrically coupling to a common conductive signal path of a port. Each pin pair coupling to a common conductive signal path is adapted to be electrically adjusted according to the distance to the adjacency of its neighboring ports. The expression:

$$b_n < Ub_n = (4x_c4 + 3X_c2 + 2X_c6 + X_c8) + (3x_c5 + 2X_c1 + 1X_c3 + 0.5X_c7) \tag{1}$$

is an estimated summation of the pairs positive polarities $\Sigma_n X_c P$ and negative polarity $\Sigma_n X_c P$ variable of magnitude, coupling compensation and pin number.

Figure 6:
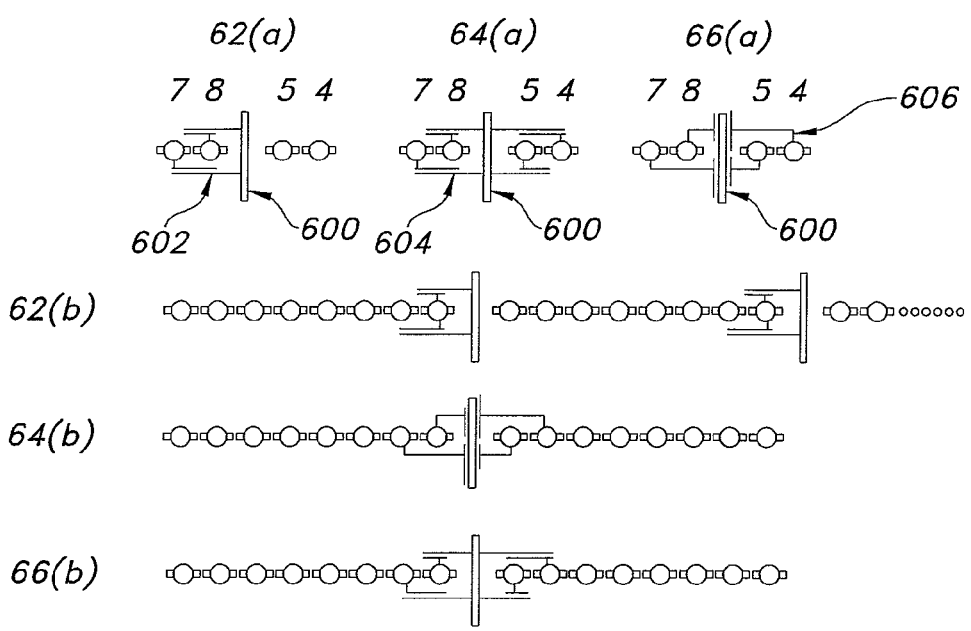
FIG. 6 provides schematic diagrams of IDC pin group locations of an exemplary PCB in accordance with an embodiment of the present disclosure.

FIG. 6 is a schematic illustrating multiple variations of IDC locations of a multiport assembly that includes two or more coupling radiators from one port coupled to one common conductive substrate 600 from one port. Each port emits unwanted port to port crosstalk to an adjacent port. Coupled noise in adjacent ports typically results from a port's left most pins to an adjacent port's right most pins or vice versa. To counter balance port to port noise, a balance conductive wall substrate 600 is placed between IDC pin groups. A balance, $b_n$, conductive substrate, 600, is coupled with dual polarities of a transmitting electrical signal, +n−n, thus producing a zero balance $0 b_n = +1n-1n$. Adjacent ports to the left or right of a transmitting port thus receive a $0 b_n$ noise.

FIG. 6 illustrates alternative formations of coupling radiators utilized for reduction of port to port crosstalk noise. Formation 62(a) illustrates an embodiment wherein coupling radiators 602 from one port are electrically coupled to a single conductive isolator substrate 600. In this exemplary embodiment, a pin of a pair that is outer-most to balance conductive isolator substrate 600 provides more coupling than the closer pin of its pair, by an amount that is dependent upon the unbalance radiated induced crosstalk noise. Formation 62(b) is a schematic illustrating formation 62(a) with all IDC pin locations present from one port to an adjacent port.

Formation 64(a) illustrates an embodiment wherein coupling radiators 604 from both ports and adjacent pin pairs are electrically coupled to a single conductive isolator substrate 600. A pin of a pair that is outer-most to conductive isolator substrate 600 provides more coupling than the closer pin of its pair, by an amount that is dependent upon the unbalance radiated induced crosstalk noise. Formation 64(b) is a schematic illustrating formation 64(a) with all IDC pin locations present from one port to an adjacent port.

Formation 66(a) illustrates an embodiment wherein coupling radiators 606 from both ports and adjacent pin pairs are electrically radiated to a single conductive isolator substrate 600. A pin of a pair that is outer-most to the balance single conductive isolator substrate 600 provides more coupling than the closer pin of its pair, by an amount that is dependent upon the unbalance radiated induced crosstalk noise. Formation 66(b) is schematic illustrating formation 66(a) with all IDC pin locations present from one port to an adjacent port.

Figure 7:
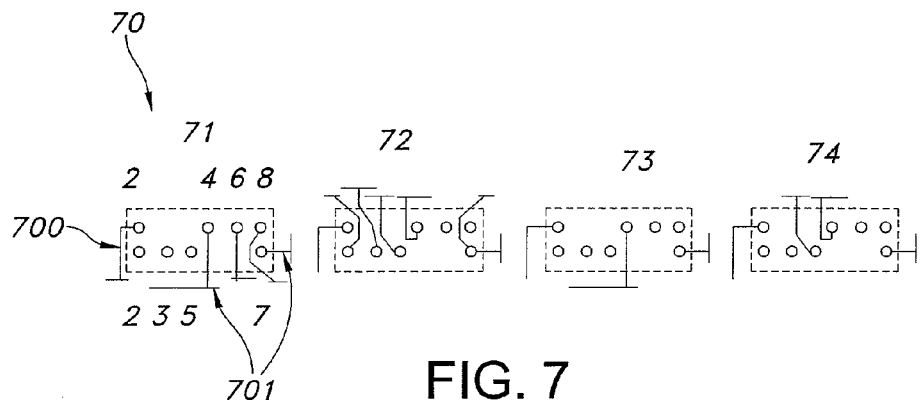
FIG. 7 is a schematic diagram of modular insert locations associated with exemplary noise re-balancer regions in accordance with an embodiment of the present disclosure.

FIG. 7 is a schematic illustrating exemplary modular insert locations of four adjacent ports 71, 72, 73, and 74 of a multiport sub assembly 70 which includes two or more coupling radiators 700 from one port placed in the direction of adjacent port's IDC pin group and its signaling trace paths. Each port emits unwanted port to port crosstalk to an adjacent port and its signaling paths. The port's signaling paths include IDC pins and signal trace paths. In a typical high density multiport sub assembly, IDC pins and signal traces of one port are located opposite of its adjacent port's modular insert plug interface on either the lower or upper side. Depending on the modular insert pin formations, one port can emit, or radiate, unbalanced EM coupling onto adjacent port's IDC pins and/or signaling traces.

To counter balance port to port crosstalk noise, a balance conductive BEMI 701 is placed in a noise compensation region. This balance, $b_n$, conductive BEMI is coupled with an opposite polarity of the unbalanced transmitted electrical signal, +n−n, thus producing a zero balance $0 bn = +1n-1n$. Adjacent ports having IDC pins and signaling traces above the modular insert location typically have at least one BEMI placed at an upper location toward the adjacent ports. Adjacent ports having IDC pins and signaling traces below the modular insert location typically have at least one BEMI placed at a lower location toward the adjacent ports. Placement of one or more BEMI adapted to compensate for port to port crosstalk noise is dependent upon formation and/or deployment of the modular insert pins. Different formations or deployments can yield different BEMI placement, radiated magnitudes, and polarities.

Figure 8:
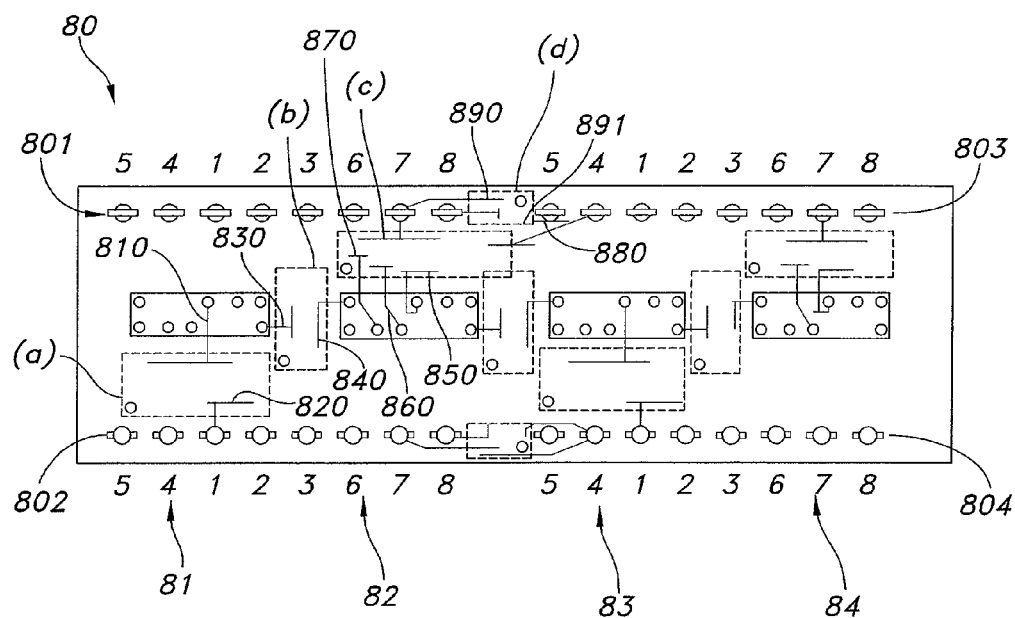
FIG. 8 is a schematic illustrating an exemplary PCB including electrical components in accordance with the present disclosure.

FIG. 8 is an exemplary schematic illustrating 4 ports of an exemplary PCB 80 with modular inserts associated with ports 81, 82, 83, and 84, each having two or more coupling radiators from one port placed in the direction of adjacent port's IDC pin group and its signaling trace paths. IDC pin groups 801, 802, 803, and 804 corresponding to ports 81, 82, 83, and 84, respectively, have pin numbering in accordance to the interface connection between a TIA 568B.1 section 6.2.1 for 100-Ohm balance twisted pair telecommunications outlet/connector T568B eight-position jack pin/pair assignment of a RJ45 modular plug.

FIG. 8 is an exemplary schematic diagram illustrating port to port noise regions (a), (b), (c), and (d) representing areas of unwanted or unbalancing electromagnetic radiated noise within PCB 80. In this exemplary embodiment, if the signaling port is port 81, then noise is generated effecting ports 82 and 83. Unwanted crosstalk noise of region (a) exists because of the close adjacencies of port 81 modular insert pins to port 82 IDC pin group 802 and respective traces. Unwanted crosstalk noise of region (b) exists because of the close adjacencies of port 81 modular insert pins to port 82 modular insert pins and respective traces. Unwanted crosstalk noise of region (c) exists because of the close adjacencies of port 81 IDC pin group 801 and respective traces to port 82 modular insert pins and respective traces. Unwanted crosstalk noise of region (d) exists because of the close adjacencies of IDC pin group 801 to port 83 IDC pin group 803.

In an exemplary embodiment, port 82 is the signaling port. The ports directly effected are ports 81, 83 and 84. Unwanted crosstalk noise reduced by compensation region (a) exists resulting from close adjacencies of the modular insert pins of port 81 relative to the IDC pin group 802 of port 82 and respective traces. Region (b) generates noise compensation with respect to crosstalk noise that results from coupling between modular insert pins of port 81 and the modular insert pins of port 82 and respective traces and modular insert pins of port 82 and port 83. Region (c) generates noise compensation with respect to crosstalk noise that results from coupling between IDC pin group 801 of port 81 and respective traces and the modular insert pins of port 82 and respective traces. Region (d) generates noise compensation with respect to crosstalk noise that results from coupling between IDC pin group 801 of port 81 and the IDC pin group 803 of port 83 as well as the IDC pin group 802 of port 82 and the IDC pin group 804 of port 84.

In an exemplary embodiment, BEMI 810 disposed in region (a), is electrically connected to the fourth terminal of port 81 and is adapted to compensate noise resulting from the first, second, fourth, and fifth IDC pins of IDC group 802. Port 71 of connector 70 shown in FIG. 7 illustrates an exemplary terminal numbering scheme which is also used in FIG. 8. BEMI 810 is adapted to compensate adjacent and unwanted noise resulting from the fifth pin of port 81 adjacency coupling region to the first, second, fourth and fifth IDC pins of IDC group 802. BEMI 820, disposed in region (a), is electrically connected to the first terminal of IDC group 82 and adapted to rebalance port 82 wire pair 2 along with BEMI 810 of port 81. By arranging multiple BEMI in such a manner, reduction of port to port induced crosstalk across the adjacent sub assembly ports can be advantageously achieved.

In an exemplary embodiment, BEMI 830 disposed in region (b), is electrically connected to the seventh terminal of port 81 and adapted to reduce noise resulting from adjacent the second modular insert pin of port 82. BEMI 830 is adapted to rebalance adjacent and unwanted noise from the eighth pin of port 81 adjacency coupling region to the first modular insert pin of port 82. Placing a BEMI from the eight pin of port 81 to the first pin of port 82 is optional, since the natural insertion of a RJ45 plug produces the imbalance EMI. BEMI 840 disposed in region (b), is electrically connected to the second terminal of port 82 and is adapted to reduce noise resulting from BEMI 830 in region (b). By arranging the BEMI in such a manner, reduction of port to port induced crosstalk across adjacent connector terminals can be advantageously achieved.

In an exemplary embodiment, BEMI 850 disposed in region (c), is electrically connected to the fourth terminal of port 82 and adapted to reduce noise resulting from the sixth, seventh and eighth pins of IDC pin group 801. BEMI 850 is adapted to rebalance adjacent and unwanted noise from the sixth, seventh, and eighth IDC traces of port 81 adjacency coupling region to the fourth and fifth pins of port 82. BEMI 860 and 870 disposed in region (c), are electrically connected to the fifth terminal and third terminal of port 82, respectively, and adapted to reduce noise resulting from the seventh IDC pin of IDC pin group 801. BEMI 860 and 870 are adapted to rebalance adjacent and unwanted noise from the seventh and eighth IDC traces of port 81 adjacency coupling region to the fourth and fifth pins of port 82. BEMI 880 placed in region (c), is electrically connected to the fourth pin of IDC pin group 803 and adapted to reduce noise resulting from the fourth and fifth pins of IDC pin group 803. BEMI 880 is adapted to rebalance adjacent and unwanted noise resulting from the fourth and fifth IDC traces of IDC pin group 802 adjacency coupling region to the eighth pins of port 82.

In an exemplary embodiment, BEMI set 890 disposed in region (d), is electrically connected to the seventh and eighth pin of IDC pin group 801 and adapted to reduce noise resulting from the fourth and fifth pins of IDC pin group 803. BEMI set 890 is adapted to rebalance adjacent and unwanted noise resulting from the seventh and eighth IDC pins of IDC pin group 801 adjacency coupling region to the fourth and fifth pins of IDC pin group 803. BEMI set 891 is electrically connected to the fourth and fifth pins of IDC pin group 803 adapted to reduce noise resulting from the seventh and eighth pins of IDC pin group 801. By arranging the BEMI sets in such a manner, reduction of port to port induced crosstalk noise across adjacent connector ports can be advantageously achieved.

In an exemplary embodiment, BEMI in all compensation regions are disposed in relative proximity to each other and adapted to simulate capacitive coupling. BEMI are also typically directly connected electrically to a signaling path from at least one port. Indirect BEMI connections are also achievable by non electrical contact with a current capable carrying source. By utilizing an indirect BEMI, a balancing conductive substrate wall can be placed in a noise region to essentially provide an EMI barrier.

Figure 9:
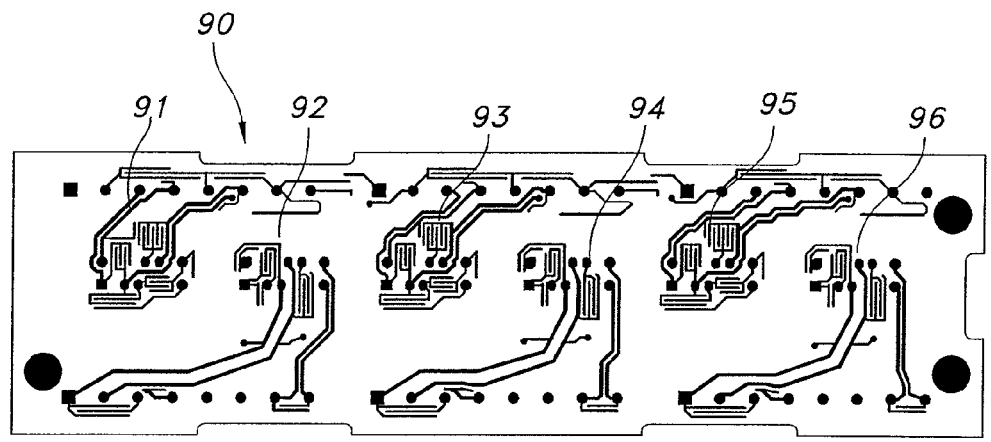
FIG. 9 is a schematic diagram illustrating a top view of an exemplary PCB in accordance with the present disclosure.

FIG. 9 is an exemplary schematic illustrating a top view of a PCB 90 having 6 ports, 91, 92, 93, 94, 95, and 96, showing modular insert pin locations. PCB 90 includes two or more coupling radiators from one port placed in regions (a), (b), (c), and (d) as shown in FIG. 8, in the direction of adjacent port's IDC pin group and signaling trace paths. The IDC groups are adapted to electrically connect to modular insert pins whose numbers are in accordance to the interface connection between a TIA 568B.1 section 6.2.1 for 100-Ohm balance twisted pair telecommunications outlet/connector T568B eight-position jack pin/pair assignment of a RJ45 modular plug. BEMI, used for balancing EM radiated noise within PCB 90, placed in regions (a), (b), (c), and (d) are adapted to electrically connect to the signaling trace paths along with internal crosstalk noise reduction circuitry.

Figure 10:
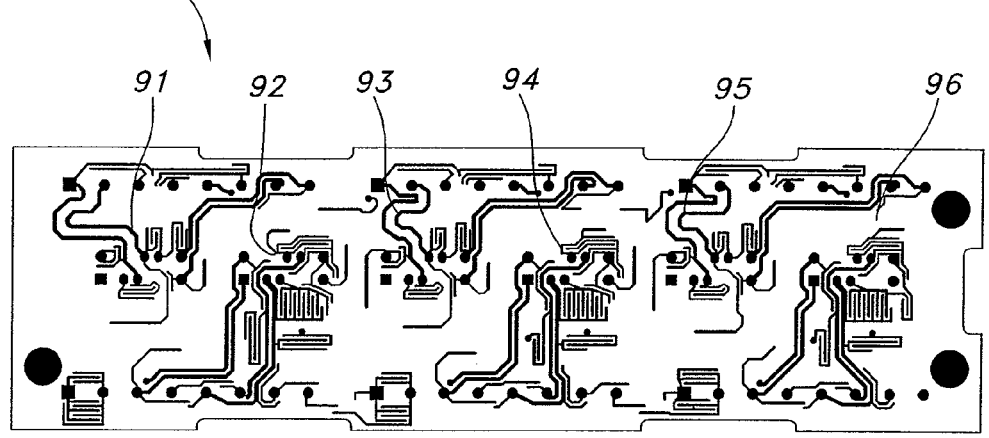
FIG. 10 is a schematic diagram illustrating a bottom view of an exemplary PCB in accordance with the present disclosure.

FIG. 10 is an exemplary schematic illustrating a bottom view of PCB 90 having 6 ports 91, 92, 93, 94, 95, and 96, showing modular insert pin locations. PCB 90 includes two or more coupling radiators from one port placed in regions (a), (b), (c), and (d) as shown in FIG. 8, in the direction of adjacent port's IDC pins and signaling trace paths. The IDC pin groups are adapted to electrically connect to modular insert pins whose numbers are in accordance to the interface connection between a TIA 568B.1 section 6.2.1 for 100-Ohm balance twisted pair telecommunications outlet/connector T568B eight-position jack pin/pair assignment of a RJ45 modular plug. BEMI, used for balancing EM radiated noise within PCB 90, placed in regions (a), (b), (c), and (d) are adapted to electrically connect to the signaling trace paths along with internal crosstalk noise reduction circuitry.

Figure 11:
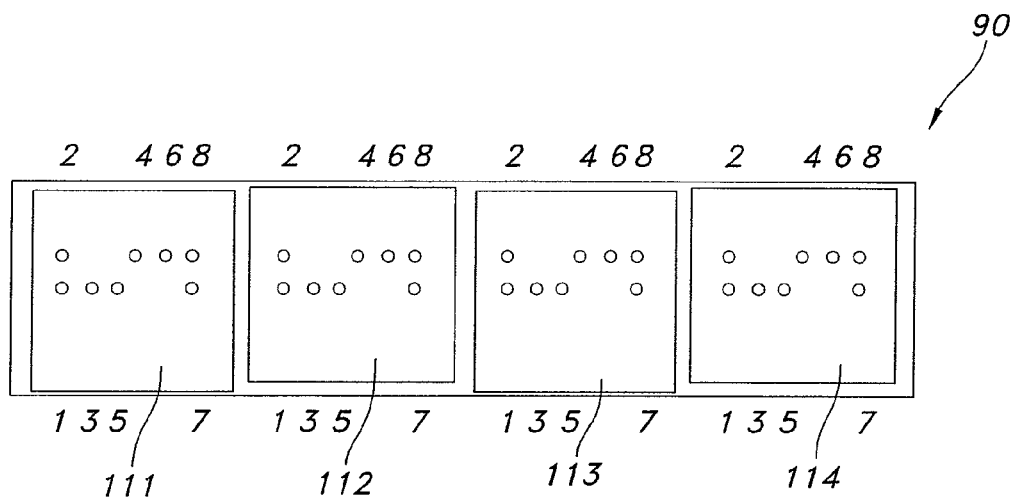
FIG. 11 is a schematic diagram of a rear housing shield layout of a PCB in accordance with an embodiment of the present disclosure.

FIG. 11 is an exemplary schematic diagram of a rear housing shield layout for PCB 90. The rear housing shields are adapted to reduce or control stray EM radiation resulting from BEMI signals. Rear housing shields 111, 112, 113, 114 are placed on each port's modular insert area. By isolating the shields, coupled radiated noise from one modular insert to its adjacent modular inserts is achievable. Non isolation of the shield areas is optional and functional. Typically, a decision as to whether to isolate is dependent upon the PCB coupling design.

Figure 12:
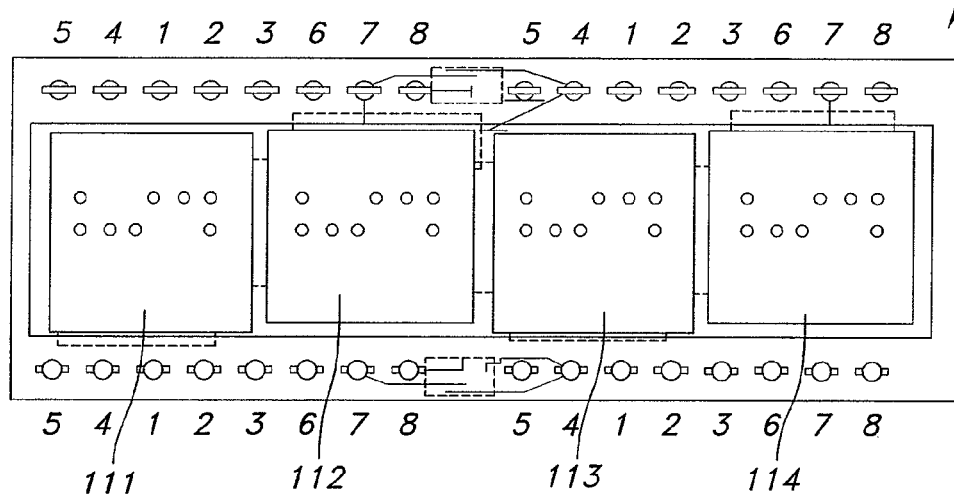
FIG. 12 is a schematic diagram of a rear housing shield layout of a top layer of a PCB in accordance with an embodiment of the present disclosure.

FIG. 12 is an exemplary schematic diagram of a top view of rear housing shield layout of PCB 90. Rear housing shields 111, 112, 113, and 114 are adapted to reduce or control stray EM radiation resulting from BEMI signals generated in regions (a), (b) and (c) as shown in FIG. 8.

Figure 13:
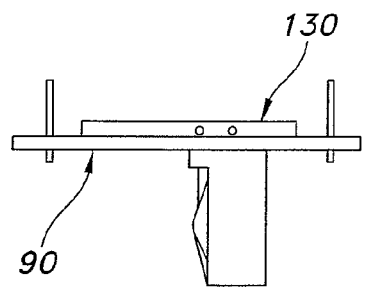
FIG. 13 is an exemplary side view of a rear housing shield for a PCB.

FIG. 13 is an exemplary schematic diagram illustrating a side view of a rear housing shield 130 for PCB 90. Rear housing shield 130 is adapted to reduce or control stray EM radiation resulting from BEMI signals generated in regions (a), (b) and (c) as shown in FIG. 8. In an exemplary embodiment, PCB 90 typically only contains a conductive shield 130 on its upper layer. However, a PCB can have a shield on a bottom layer or both a top and bottom layer. This exemplary embodiment allows BEMI coupling in confined areas and reduces unwanted coupling to adjacent IDC pins.

By forming a multiport assembly as described in the exemplary embodiments, port to port crosstalk noise is reduced without requiring new equipment or expensive re-wiring. Furthermore, by utilizing a combination of appropriately placed BEMI positive and negative reactance circuitry and a low reactance dielectric contact insert holder as described, external, as well as, internal victim crosstalk noise is substantially reduced. Moreover, by using a low reactance dielectric insert and the BEMI reactance technique, the amount of unwanted signals can be adjusted to cancel that which was generated by a plug input, modular insert and IDC pins, thus improving the system SNR.

While the present disclosure includes a description of the invention with reference to various specific embodiments, those skilled in the art will readily appreciate that various modifications, changes and enhancements may be made thereto without departing from the spirit or scope of the invention as defined by the appended claims. In sum, the systems and methods of the present disclosure offer significantly enhanced techniques for reducing port to port crosstalk noise for multiport connector assemblies.

What is claimed:

1. A method of reducing port to port crosstalk on a multiport assembly comprising:
    placing at least one BEMI in at least one compensation region, disposed on a PCB, said BEMI being adapted to reduce port to port crosstalk noise by generating an opposite polarity signal to an unwanted noise signal generated through port to port adjacency;
    wherein said PCB includes a plurality of ports, said plurality of ports at least including a first port and a second port, said first port and said second port being disposed adjacent to each other;
    wherein each port of said plurality of ports includes a plurality of modular insert pins, and is associated with an IDC pin group;
    wherein said at least one compensation region includes one selected from the group consisting of:
        (a) a first region generating noise compensation with respect to crosstalk noise that results from coupling between at least one modular insert pin of said first port and at least one IDC pin associated with said second port,
        (b) a second region generating noise compensation with respect to crosstalk noise that results from coupling between at least one modular insert pin of said first port and at least one modular insert pin of said second port,
        (c) a third region generating noise compensation with respect to crosstalk noise that results from coupling between at least one IDC pin associated with said first port and at least one modular insert pin of said second port, and
        (d) a combination thereof; and
    wherein each of said first port and said second port is an RJ45 jack port, and each of said plurality of modular insert pins of said first port and said plurality of modular insert pins of said second port comprises respective first, second, third, fourth, fifth, sixth, seventh, and eighth modular insert pins mounted to said PCB such that the corresponding pluralities of modular insert pins form similar respective two-row arrays, an upper row of which including, in sequence, said second, fourth, sixth, and eighth modular insert pins, a lower row of which including, in sequence, said first, third, fifth, and seventh modular insert pins, a leftmost column of which including said first modular insert pin and said second modular insert pin, and a rightmost column of which including said seventh modular insert pin and said eighth modular insert pin.

2. A method according to claim 1, wherein at least one coupling radiator is disposed in said at least one compensation region and is electrically coupled to at least one electrical component of said plurality of ports.

3. A method according to claim 2, wherein at least one balancing conductive substrate is disposed in said at least one compensation region and is in electrical communication with at least one of said disposed coupling radiators.

4. A method according to claim 1, wherein at least one BEMI is placed in each of said first, second, and third regions.

5. A method according to claim 4, wherein at least one coupling radiator is placed in each of said first, second, and third regions.

6. A method according to claim 5, wherein said multiport assembly includes a front housing sub assembly and a rear IDC housing adapted to connect to said PCB to form a multiport connector assembly.

7. A method according to claim 6, wherein each of said plurality of ports of said multiport connector assembly is adapted to electrically interface with a RJ45 modular plug.

8. A method according to claim 7, wherein a rear housing shield is placed on a member of the group consisting of a top layer of said PCB, a bottom layer of said PCB, and both top and bottom layers of said PCB, and is adapted to reduce strayed EM radiation resulting from BEMI coupling.

9. A method according to claim 1, wherein said plurality of ports further includes a third port adjacent to said second port across from said first port, wherein each IDC pin group associated with said plurality of ports has 8 IDC pins, and wherein the respective IDC pin groups associated with said first and third ports are axially aligned substantially parallel to an end of said PCB, and wherein said at least one compensation region further includes a fourth region generating noise compensation with respect to crosstalk noise that results from coupling between at least one IDC pin associated with said first port and at least one IDC pin associated with said third port.

10. A method according to claim 9, wherein with respect to said fourth region, said at least one IDC pin associated with said first port at least includes respective IDC pins arranged in direct electrical communication with said seventh and eighth modular insert pins of said first port, and said at least one IDC pin associated with said third port at least includes respective IDC pins arranged in direct electrical communication with said fourth and fifth modular insert pins of said third port.

11. A method according to claim 1, wherein said rightmost column of the two-row array associated with the first port and the leftmost column of the two-row array associated with said second port are adjacent to each other such that said respective two-row arrays associated with said first and second ports are axially aligned with each other.

12. A method according to claim 11, wherein said at least one compensation region at least includes said second region, and wherein with respect to said second region, said at least one modular insert pin of said first port at least includes said eighth modular insert pin of said first port, and said at least one modular insert pin of said second port at least includes said first modular insert pin of said second port.

13. A method according to claim 11, wherein said at least one compensation region at least includes said second region, and wherein with respect to said second region, said at least one modular insert pin of said first port at least includes said seventh modular insert pin of said first port, and said at least one modular insert pin of said second port at least includes said second modular insert pin of said second port.

14. A method according to claim 11, wherein the respective IDC pin groups associated with said first and second ports form respective one-row arrays extending substantially in parallel with each other along and adjacent to opposite respective sides of said first and second ports corresponding to one or the other of said upper row and said lower rows of said similar respective two-row arrays associated therewith.

15. A method according to claim 14, wherein said at least one compensation region at least includes said first region, and wherein with respect to said first region, said at least one modular insert pin of said first port at least includes said fourth modular insert pin thereof, and said at least one IDC pin associated with said second port at least includes an IDC pin arranged in direct electrical communication with said first modular insert pin of said second port.

16. A method according to claim 14, wherein said at least one compensation region at least includes said first region, and wherein with respect to said first region, said at least one modular insert pin of said first port at least includes said fourth modular insert pin thereof, and said at least one IDC pin associated with said second port at least includes respective IDC pins arranged in direct electrical communication with said first, second, fourth, and fifth modular insert pins of said second port.

17. A method according to claim 14, wherein said at least one compensation region at least includes said third region, and wherein with respect to said third region, said at least one modular insert pin of said second port at least includes said fourth modular insert pin thereof, and said at least one IDC pin associated with said first port at least includes respective IDC pins arranged in direct electrical communication with said sixth, seventh, and eighth modular insert pins of said first port.

18. A method according to claim 14, wherein said at least one compensation region at least includes said third region, and wherein with respect to said third region, said at least one modular insert pin of said second port at least includes each of said fourth and fifth modular insert pins thereof, and said at least one IDC pin associated with said first port at least includes respective IDC pins arranged in direct electrical communication with said sixth, seventh, and eighth modular insert pins of said first port.

19. A method according to claim 14, wherein said at least one compensation region at least includes said third region, and wherein with respect to said third region, said at least one modular insert pin of said second port at least includes each of said fourth and fifth modular insert pins thereof, and said at least one IDC pin associated with said first port at least includes respective IDC pins arranged in direct electrical communication with said seventh and eighth modular insert pins of said first port.

* * * * *